United States Patent
Masuda et al.

(10) Patent No.: US 9,443,960 B2
(45) Date of Patent: Sep. 13, 2016

(54) SEMICONDUCTOR DEVICE AND FABRICATION METHOD THEREOF

(71) Applicant: Sumitomo Electric Industries, Ltd., Osaka-shi (JP)

(72) Inventors: Takeyoshi Masuda, Osaka (JP); Keiji Wada, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/643,140

(22) Filed: Mar. 10, 2015

(65) Prior Publication Data

US 2015/0179765 A1    Jun. 25, 2015

Related U.S. Application Data

(63) Continuation of application No. 13/522,216, filed as application No. PCT/JP2011/074511 on Oct. 25, 2011, now Pat. No. 9,006,745.

(30) Foreign Application Priority Data

Nov. 1, 2010 (JP) ................................ 2010-245187

(51) Int. Cl.
*H01L 29/66* (2006.01)
*H01L 29/10* (2006.01)
(Continued)

(52) U.S. Cl.
CPC ... *H01L 29/66734* (2013.01); *H01L 21/02233* (2013.01); *H01L 21/02378* (2013.01);
(Continued)

(58) Field of Classification Search
CPC ............... H01L 29/45; H01L 29/1608; H01L 29/0623; H01L 29/0465; H01L 29/7813; H01L 29/7802; H01L 29/1095; H01L 29/66068

USPC .......... 257/77, 339, 611, 219, 220; 438/140, 438/270, 514

See application file for complete search history.

(56) References Cited

U.S. PATENT DOCUMENTS 5,489,787 A * 2/1996 Amaratunga ....... H01L 29/1095
257/132
6,281,546 B1  8/2001 Ozeki et al.
(Continued)

FOREIGN PATENT DOCUMENTS

CN    101064344 A    10/2007
CN    101558475 A    10/2009
(Continued)

OTHER PUBLICATIONS

Notice of Grounds of Rejection in Japanese Patent Application No. 2010-245187, dated Jun. 10, 2014.
(Continued)

*Primary Examiner* — Karen Kusumakar
(74) *Attorney, Agent, or Firm* — Venable LLP; Michael A. Sartori; F. Brock Riggs

(57) ABSTRACT

An MOSFET includes a silicon carbide substrate, an active layer, a gate oxide film, and a gate electrode. The active layer includes a body region where an inversion layer is formed at a region in contact with the gate oxide film by application of voltage to the gate electrode. The body region includes a low concentration region arranged at a region where an inversion layer is formed, and containing impurities of low concentration, and a high concentration region adjacent to the low concentration region in the carrier mobile direction in the inversion layer, arranged in a region where the inversion layer is formed, and containing impurities higher in concentration than in the low concentration region.

7 Claims, 8 Drawing Sheets

(51) Int. Cl.

| | | |
|---|---|---|
| *H01L 29/16* | (2006.01) | |
| *H01L 29/78* | (2006.01) | |
| *H01L 21/02* | (2006.01) | |
| *H01L 29/08* | (2006.01) | |
| *H01L 29/417* | (2006.01) | |
| *H01L 29/423* | (2006.01) | |
| *H01L 21/04* | (2006.01) | |
| *H01L 29/06* | (2006.01) | |
| *H01L 29/45* | (2006.01) | |

(52) U.S. Cl.
CPC ....... *H01L21/02529* (2013.01); *H01L 21/049* (2013.01); *H01L 29/086* (2013.01); *H01L 29/1033* (2013.01); *H01L 29/1095* (2013.01); *H01L 29/1608* (2013.01); *H01L 29/41741* (2013.01); *H01L 29/4236* (2013.01); *H01L 29/6634* (2013.01); *H01L 29/66068* (2013.01); *H01L 29/66348* (2013.01); *H01L 29/66727* (2013.01); *H01L 29/7802* (2013.01); *H01L 29/7813* (2013.01); *H01L 21/02255* (2013.01); *H01L 21/0465* (2013.01); *H01L 29/0623* (2013.01); *H01L 29/45* (2013.01)

(56) References Cited

U.S. PATENT DOCUMENTS

| | | |
|---|---|---|
| 6,787,847 B2 | 9/2004 | Disney |
| 8,188,539 B2 | 5/2012 | Reynes et al. |
| 2001/0026977 A1 | 10/2001 | Hattori et al. |
| 2003/0080384 A1 | 5/2003 | Takahashi et al. |
| 2003/0164512 A1 | 9/2003 | Alok et al. |
| 2003/0201482 A1* | 10/2003 | Shimoida ............ H01L 21/0465 257/302 |
| 2004/0119076 A1 | 6/2004 | Ryu |
| 2005/0133833 A1 | 6/2005 | Tsui |
| 2006/0267022 A1 | 11/2006 | Mizukami et al. |
| 2007/0045700 A1 | 3/2007 | Ohtani et al. |
| 2007/0057262 A1 | 3/2007 | Nakamura et al. |
| 2007/0252173 A1 | 11/2007 | Hayashi et al. |
| 2008/0121933 A1* | 5/2008 | Hayashi ............ H01L 29/0623 257/192 |
| 2009/0236660 A1* | 9/2009 | Takahashi ........... H01L 29/1095 257/334 |
| 2009/0289277 A1 | 11/2009 | Yamaguchi |
| 2010/0035420 A1 | 2/2010 | Tamaso et al. |
| 2011/0068353 A1 | 3/2011 | Nakano |

FOREIGN PATENT DOCUMENTS

| | | |
|---|---|---|
| EP | 1 132 970 A2 | 9/2001 |
| EP | 2 081 231 A2 | 7/2009 |
| EP | 2 293 336 A1 | 3/2011 |
| JP | 59-074674 A | 4/1984 |
| JP | 07-058332 A | 3/1995 |
| JP | 07-221305 A | 8/1995 |
| JP | 10-229191 A | 8/1998 |
| JP | 2001-127285 A | 5/2001 |
| JP | 2001-250947 A | 9/2001 |
| JP | 2002-261095 A | 9/2002 |
| JP | 2005-252157 A | 9/2005 |
| JP | 2007-059805 A | 3/2007 |
| JP | 2007-080971 A | 3/2007 |
| JP | 2008177279 A | 7/2008 |
| JP | 2009-054765 A | 3/2009 |
| JP | 2009-194164 A | 8/2009 |
| JP | 2010-004003 A | 1/2010 |
| WO | WO-2008/069145 A1 | 6/2008 |
| WO | WO-2008/072482 A1 | 6/2008 |
| WO | WO-2009/142233 A1 | 11/2009 |

OTHER PUBLICATIONS

Extended European Search Report in European Patent Application No. 11837899.1, dated Jul. 7, 2014.
Notification of First Office Action issued in Chinese Patent Application No. 201180010752.0 dated Jun. 30, 2014.
Final Decision for Rejection issued in Japanese Patent Application No. 2010-245187 dated Nov. 25, 2014.

* cited by examiner

SEMICONDUCTOR DEVICE AND FABRICATION METHOD THEREOF

CROSS-REFERENCE TO RELATED APPLICATIONS

This application is a Continuation of U.S. patent application Ser. No. 13/522,216, filed on Jul. 13, 2012 which is a 371 application of International Application No. PCT/JP2011/074511, filed on Oct. 25, 2011, which claims the benefit of priority of the prior Japanese Patent Application No. 2010-245187, filed on Nov. 1, 2010, the entire contents of all of which are incorporated herein by reference.

TECHNICAL FIELD

The present invention relates to a semiconductor device and a method of fabricating the semiconductor device. More particularly, the present invention relates to a semiconductor device that can have ON resistance reduced while suppressing occurrence of punch-through, and a method of fabricating the semiconductor device.

BACKGROUND ART

In order to allow high breakdown voltage, low loss, usage under a high temperature environment and the like for semiconductor devices, the usage of silicon carbide is continuing to advance in recent years as the material for forming semiconductor devices. Silicon carbide is a wide band gap semiconductor having a band gap greater than silicon that is conventionally used widely as a material forming semiconductor devices. The usage of silicon carbide as the material forming a semiconductor device allows high breakdown voltage, reduction in ON resistance and the like of semiconductor devices. Furthermore, a semiconductor device based on silicon carbide material is advantageous in that degradation in the property, when used under a high temperature environment, is small as compared to a semiconductor device based on carbide material.

For semiconductor devices controlling the formation of an inversion layer at a channel region in accordance with a predetermined threshold voltage to pass and cut off current such as an MOSFET (Metal Oxide Semiconductor Field Effect Transistor) and IGBT (Insulated Gate Bipolar Transistor), among semiconductor devices employing silicon carbide as the material, various approaches have been made to reduce ON resistance while suppressing resistance in the channel region (for example, refer to Japanese Patent Laying-Open No. 2007-80971 (PTL 1) and Japanese Patent Laying-Open No. 2002-261095 (PTL 2)).

CITATION LIST

Patent Literature

PTL 1: Japanese Patent Laying-Open No. 2007-80971
PTL 2: Japanese Patent Laying-Open No. 2002-261095

SUMMARY OF INVENTION

Technical Problem

In semiconductor devices employing silicon carbide as the material and having the aforementioned inversion layer formed, there is a problem that channel mobility is degraded as the impurity concentration of the body region in which the inversion layer is formed is increased. Therefore, the impurity concentration of the body region is suppressed to be below a predetermined value, for example approximately less than or equal to $2 \times 10^{16}$ cm$^{-3}$, for example. However, the channel length cannot be made shorter than a predetermined value, for example, not shorter than 0.6 μm, in order to avoid a completely depleted state of the body region (punch-through). As a result, there is a limit in reducing the ON resistance by reducing the channel length. In other words, it is difficult to reduce ON resistance while suppressing occurrence of punch-through by conventional art.

An object of the present invention is to provide a semiconductor device that can have ON resistance reduced while suppressing occurrence of punch-through, and a method of fabricating the semiconductor device.

Solution to Problem

A semiconductor according to the present invention includes a substrate made of silicon carbide, an epitaxial growth layer made of silicon carbide and formed on the substrate, a gate insulation film made of an insulator, and arranged in contact with the epitaxial growth layer, and a gate electrode arranged in contact with the gate insulation film. The epitaxial growth layer includes a body region where an inversion layer is formed at a region in contact with the gate insulation film by application of voltage to the gate electrode. The body region includes a low concentration region arranged at the region where an inversion layer is formed, and containing impurities of low concentration, and a high concentration region adjacent to the low concentration region in a carrier mobile direction in the inversion layer, arranged at the region where an inversion layer is formed, and containing impurities higher in concentration than in the low concentration region.

Since a low concentration region containing impurities of low concentration is arranged in a region of the body region where an inversion layer is to be formed in the semiconductor device of the present invention, reduction in channel mobility is suppressed. Further, a high concentration region containing impurities of a concentration higher than the concentration of the low concentration region is arranged adjacent to the low concentration region in the region where an inversion layer is to be formed. Therefore, the spread of a depletion layer in the region of the body region where an inversion layer is to be formed can be reduced. As a result, punch-through can be suppressed effectively even if the channel length is shortened. In other words, the semiconductor device of the present invention has the combination of a low concentration region that can ensure high channel mobility and a high concentration region that can suppress punch-through arranged in the region where an inversion layer is to be formed. Therefore, high mobility can be ensured while suppressing punch-through even in the case where the channel length is shortened. As a result, the semiconductor device of the present invention can have ON resistance reduced while suppressing occurrence of punch-through.

The impurity concentration of the low concentration region is preferably suppressed to a level that can ensure sufficiently high channel mobility. Specifically, the impurity concentration of the low concentration region is preferably less than or equal to $2 \times 10^{16}$ cm$^{-3}$.

In the semiconductor device set forth above, the high concentration region may be arranged downstream of the low concentration region in the carrier mobile direction.

Accordingly, the effect of suppressing punch-through can be improved by the arrangement of the high concentration region.

In the semiconductor device set forth above, the channel length may be less than or equal to 0.5 μm. The semiconductor device of the present invention is suitable for a semiconductor device having such a short channel length.

In the semiconductor device set forth above, the impurity concentration of the high concentration region may be greater than or equal to $1\times10^{17}$ cm$^{-3}$, and less than or equal to $1\times10^{18}$ cm$^{-3}$. If the impurity concentration is below $1\times10^{17}$ cm$^{-3}$, the effect of suppressing punch-through may be insufficient. If the impurity concentration exceeds $1\times10^{18}$ cm$^{-3}$, reduction in carrier mobility may be too great. In consideration of the balance between adversely affecting carrier mobility and suppressing punch-through, the impurity concentration of the high concentration region is preferably greater than or equal to $1\times10^{17}$ cm$^{-3}$, and less than or equal to $1\times10^{18}$ cm$^{-3}$.

A method of fabricating a semiconductor device according to the present invention includes the steps of preparing a substrate made of silicon carbide, forming an epitaxial growth layer made of silicon carbide on the substrate, forming a body region at the epitaxial growth layer, forming a gate insulation film made of an insulator to come into contact above the epitaxial growth layer, and forming a gate electrode to which voltage is applied to form an inversion layer in a region of the body region in contact with the gate insulation film. The step of forming a body region includes the steps of forming a mask layer having an opening on the epitaxial growth layer, forming a first concentration region having a first impurity concentration at a region where an inversion layer is formed by applying ion implantation with the mask layer as a mask, enlarging the opening by etching the mask layer, and forming a second concentration region having a second impurity concentration differing from the first impurity concentration adjacent to the first concentration region in a carrier mobile direction in the inversion layer, and at a region where the inversion layer is formed, by executing ion implantation using the mask layer having the opening enlarged as a mask.

By ion implantation through self alignment according to a method of fabricating a semiconductor device of the present invention, the semiconductor device of the present invention set forth above can be produced readily.

Advantageous Effects of Invention

In accordance with the semiconductor device and the method of fabricating the semiconductor device of the present invention, as apparent from the description in the foregoing, a semiconductor device that can have ON resistance reduced while suppressing occurrence of punch-through and a method of fabricating the semiconductor device can be provided.

DESCRIPTION OF EMBODIMENTS

Figure 1:
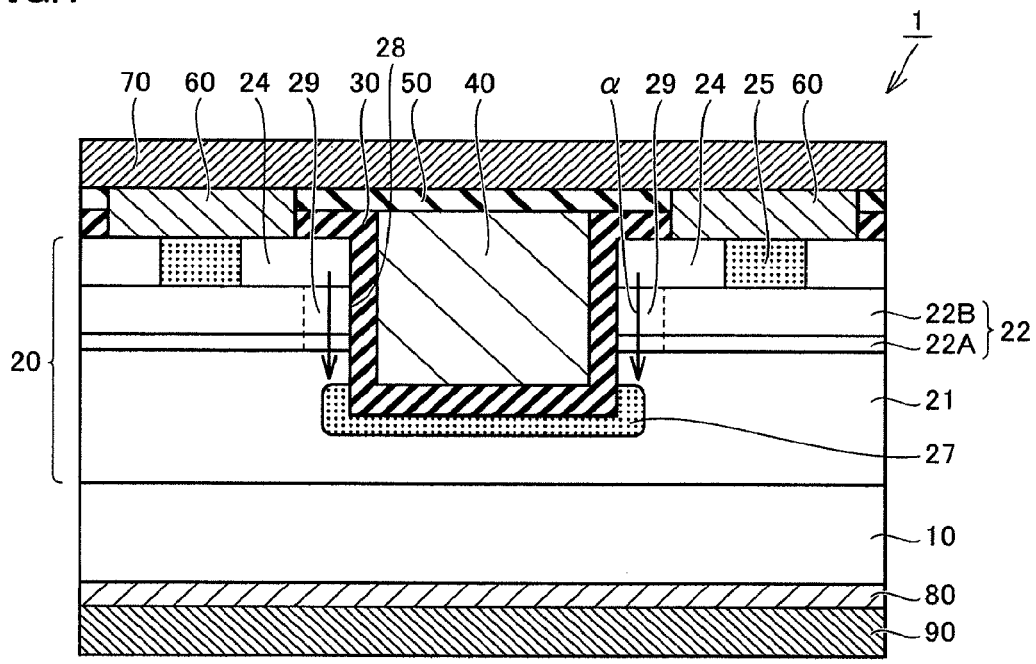
FIG. 1 is a schematic sectional view of a configuration of an MOSFET according to an embodiment of the present invention.

Embodiments of the present invention will be described hereinafter with reference to the drawings. In the drawings, the same or corresponding elements have the same reference characters allotted, and description thereof will not be repeated.

First Embodiment

Referring to FIG. 1, an MOSFET 1 identified as a semiconductor device according to the present embodiment that is one embodiment of the present invention includes a silicon carbide substrate 10, and an active layer that is an epitaxial growth layer made of silicon carbide, arranged on one main face of silicon carbide substrate 10.

Silicon carbide substrate 10 is made of single crystal silicon carbide, having an n type conductivity (first conductivity type) by containing impurities such as nitrogen and phosphorus (n type impurity). In active layer 20 is formed a trench 28 opening at a main face at the side opposite to silicon carbide substrate 10, extending towards silicon carbide substrate 10, and having a bottom in active layer 20. Active layer 20 includes a drift layer 21, a body region 22, an n$^+$ source region 24, a p$^+$ contact region 25, and a p$^+$ field alleviation region 27.

Drift layer 21 is arranged on silicon carbide substrate 10, and has n type conductivity by containing n type impurities lower in concentration than silicon carbide substrate 10. The bottom of trench 28 is located in drift layer 21. Body region 22 is arranged on drift layer 21, and in contact with the sidewall of trench 28. Body region 22 has p type conductivity (second conductivity type) by containing impurities such as aluminum and boron (p type impurity). N+ source region 24 is arranged on body region 22, in contact with the sidewall of trench 28, and including a main face of active layer 20 at a side opposite to silicon carbide substrate 10. N+ source region 24 has n type conductivity by containing n type impurities higher in concentration than that of drift layer 21.

P+ contact region 25 is located on body region 22 and at a side opposite to trench 28 relative to n+ source region 24, and arranged to include a main face of active layer 20 at the side opposite to silicon carbide substrate 10. P+ contact region 25 has p type conductivity by containing p type impurities. P+ field alleviation region 27 forms contact with the entire bottom of trench 28 in drift layer 21, and extends to a position in contact with a portion of the sidewall of trench 28. P+ field alleviation region 27 has p type conductivity by containing p type impurities.

Body region 22 includes a low concentration region 22B arranged in contact with n+ source region 24 and p+ contact region 25, and containing p type impurities of low concentration, and a high concentration region 22A arranged so as to be sandwiched between low concentration region 22B and drift layer 21, and containing p type impurities higher in concentration than in low concentration region 22B. The concentration of p type impurities of low concentration region 22B is, for example, less than or equal to $2 \times 10^{16}$ cm$^{-3}$. The concentration of p type impurities of high concentration region 22A is, for example, greater than or equal to $1 \times 10^{17}$ cm$^{-3}$ and less than or equal to $1 \times 10^{18}$ cm$^{-3}$.

MOSFET 1 further includes a gate oxide film 30, a gate electrode 40, a source contact electrode 60, an interlayer insulation film 50, a source interconnection 70, a drain contact electrode 80, and a back protection electrode 90.

Gate oxide film 30 is formed of an insulator such as of silicon dioxide, and arranged to cover the bottom wall and sidewall of trench 28, and to extend up to the main face of active layer 20 at the side opposite to silicon carbide substrate 10. Gate electrode 40 is arranged to fill the interior of trench 28 covered with gate oxide film 30, and is formed of a conductor such as of aluminum.

Source contact electrode 60 is arranged on active layer 20 to form contact with n+ source region 24 and p+ contact region 25. In other words, source contact electrode 60 is arranged to form contact with a region on active layer 20 not covered with gate oxide film 30. Source contact electrode 60 is made of a conductor such as of nickel, and has at least the region in contact with active layer 20 silicidized to form an ohmic contact with n+ source region 24.

Interlayer insulation film 50 is arranged on and to cover gate electrode 40, and extends as far as above gate oxide film 30. Interlayer insulation film 50 is formed of a an insulator such as of silicon dioxide. Source interconnection 70 is arranged to form contact with source contact electrode 60, and to cover source contact electrode 60 and interlayer insulation film 50. Source interconnection 70 is formed of a conductor such as of aluminum.

Drain contact electrode 80 is arranged in contact on the main face of silicon carbide substrate 10 at a side opposite to active layer 20. Drain contact electrode 80 is formed of a conductor such as of nickel, having at least the region in contact with silicon carbide substrate 10 silicidized to form an ohmic contact with silicon carbide substrate 10. Back protection electrode 90 is arranged on and in contact with and to cover drain contact electrode 80. Back protection electrode 90 is formed of a conductor such as of aluminum.

The operation of MOSFET 1 will be described hereinafter. Referring to FIG. 1, in the case where the voltage of gate electrode 40 is below the threshold voltage, i.e. in an OFF state, the pn junction between body region 22 and drift layer 21 is on a reverse bias, attaining a non-conductive state, even if voltage is applied to drain contact electrode 80 and back protection electrode 90. When a voltage greater than or equal to the threshold voltage is applied to gate electrode 40, an inversion layer 29 is formed in a region of body region 22 in the proximity of contact with gate oxide film 30. As a result, electrical connection is established between n+ source region 24 and drift layer 21. Electrons that are carriers move in the direction of arrow a to cause current flow.

In other words, MOSFET 1 that is a trench type MOSFET includes a silicon carbide substrate 10 made of silicon carbide, an active layer 20 that is an epitaxial growth layer made of silicon carbide and formed on silicon carbide substrate 10, a gate oxide film 30 as a gate insulation film made of an insulator, and arranged in contact with active layer 20, and a gate electrode 40 arranged in contact with gate oxide film 30. Active layer 20 includes a body region 22 in which an inversion layer 29 is formed in the region in contact with gate oxide film 30 by application of voltage to gate electrode 40. Body region 22 includes a low concentration region 22B arranged to include the region where inversion layer 29 is formed, and containing impurities of low concentration, and a high concentration region 22A adjacent to low concentration region 22B in a carrier mobile direction (direction of arrow a) in inversion layer 29, arranged to include a region where inversion layer 29 is formed, and containing impurities higher in concentration than in low concentration region 22B.

In MOSFET 1 of the present embodiment, low concentration region 22B that can ensure high channel mobility and high concentration region 22A that can suppress punch-through are arranged in combination at a region in body region 22 where inversion layer 29 is to be formed. Therefore, high channel mobility can be ensured while suppressing punch-through even in the case where the channel length is shortened. As a result, MOSFET 1 of the present embodiment is a semiconductor that can have ON resistance reduced while suppressing occurrence of punch-through.

Although high concentration region 22A can be arranged at a side upstream of low concentration region 22B in the carrier mobile direction (direction of arrow a) in MOSFET 1 set forth above, the arrangement of high concentration region 22A at a side downstream of low concentration region 22B in the carrier mobile direction (direction of arrow a), as shown in FIG. 1, allows the effect of suppressing punch-through to be further increased.

Further, since a body region 22 including a high concentration region 22A and a low concentration region 22B is employed in MOSFET 1, occurrence of punch-through can be suppressed even if the channel length is reduced as short as 0.5 μm or less. In addition to suppressing punch-through, the above-described configuration of MOSFET 1 of the present embodiment suppresses reduction of the threshold voltage, which may previously occur in the case where the channel length is set as short as 0.5 μm or less, suppresses the event of the current not being saturated when the drain voltage is high, and suppresses the event of degradation in the subthreshold coefficient.

In MOSFET 1 set forth above, the impurity concentration of high concentration region 22A is preferably greater than or equal to $1 \times 10^{17}$ cm$^{-3}$ and less than or equal to $1 \times 10^{18}$ cm$^{-3}$. Accordingly, the balance between the effect of suppressing punch-through and adversely affecting carrier mobility can be ensured favorably.

Figure 2:
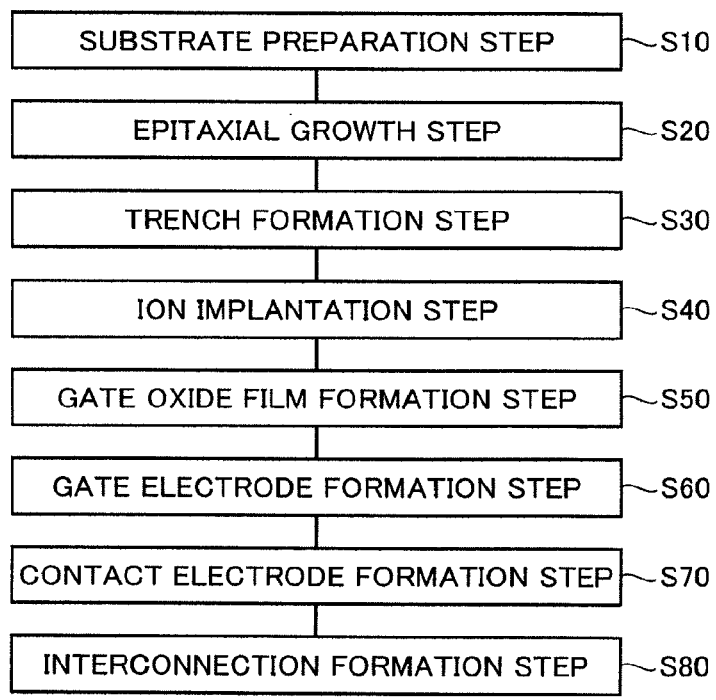
FIG. 2 is a flowchart schematically representing the fabrication procedure of an MOSFET.
Figure 3:
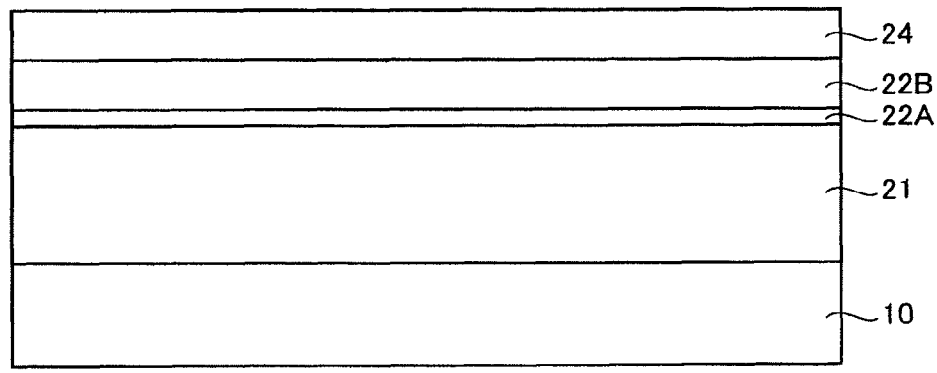
FIG. 3 is a schematic sectional view to describe a method of fabricating an MOSFET.

An example of a method of fabricating MOSFET 1 according to the present embodiment will be described hereinafter with reference to FIGS. 2-8. Referring to FIG. 2, in the method of fabricating MOSFET 1 of the present embodiment, a substrate preparation step is executed as step S10. Referring to FIG. 3, a silicon carbide substrate 10 obtained from an ingot of single crystal silicon carbide produced by sublimation is prepared in step S10.

Then, an epitaxial growth step is executed as step S20. Referring to FIG. 3, drift layer 21 of n conductivity type, high concentration region 22A of p type conductivity, low concentration region 22B of p type conductivity, and n$^+$ source region 24 of n type conductivity are sequentially formed on one main face of silicon carbide substrate 10 by epitaxial growth in step S20. For n type impurities to attain n type conductivity, nitrogen, phosphorus, and the like can be employed. For p type impurities to attain p type conductivity, aluminum, boron, and the like can be employed.

Then, a trench formation step is executed as step S30. In step S30, a trench 28 is formed through low concentration region 22B and high concentration region 22A from the main face of n$^+$ source region 24 at the side opposite to silicon carbide substrate 10, and extending as far as drift layer 21. Specifically, trench 28 can be formed by the procedure set forth below. First, an oxide layer made of silicon dioxide is formed on n$^+$ source region 24. Then, a resist is applied on the oxide layer, followed by exposure and developing to form a resist film having an opening corresponding to the region where formation of trench 28 is desired. Using this resist film as a mask, the oxide layer is etched to form an opening at the region where trench 28 is to be formed. Following removal of the resist film, trench 28 is formed by RIE (Reactive Ion Etching), for example, using the oxide film with an opening as a mask.

Figure 4:
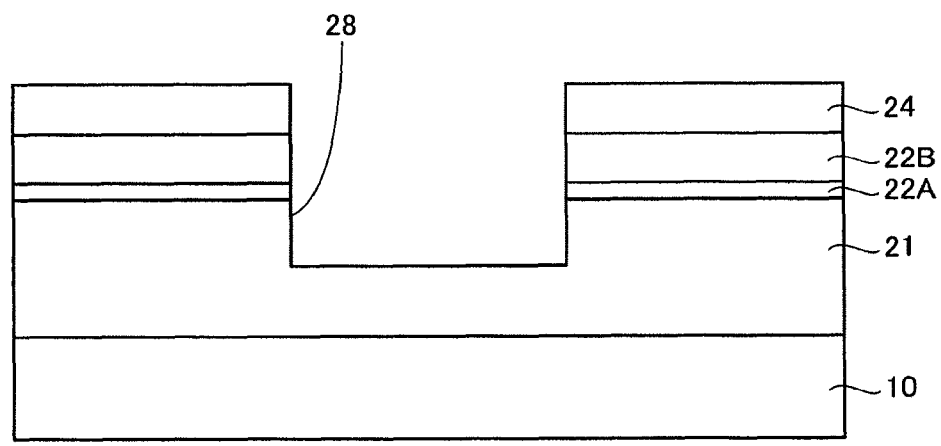
FIG. 4 is a schematic sectional view to describe a method of fabricating an MOSFET.
Figure 5:
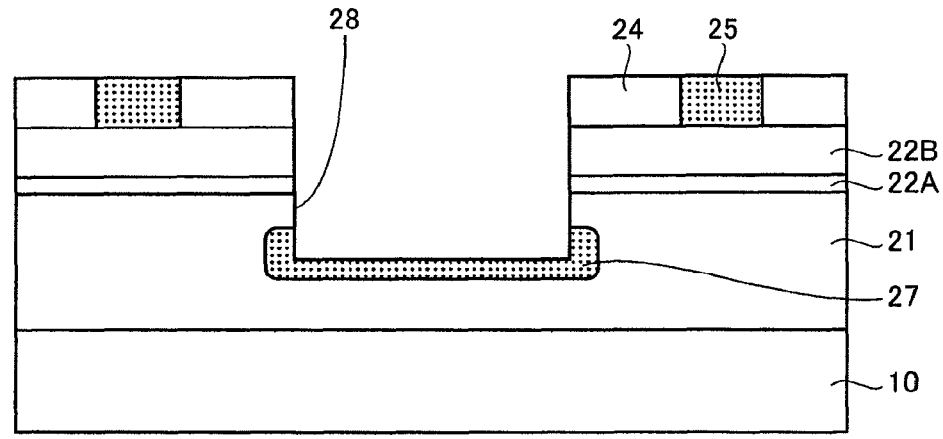
FIG. 5 is a schematic sectional view to describe a method of fabricating an MOSFET.

Then, an ion implantation step is executed as step S40. Referring to FIGS. 4 and 5, p$^+$ contact region 25 and p$^+$ field alleviation region 27 are formed by ion implantation at step S40. Specifically, similar to step S30 set forth above, an oxide layer having an opening at a desired region for ion implantation is formed, followed by implanting ions of p type impurities using the oxide layer as a mask. Then, activation annealing of heating at a predetermined temperature is executed to form p$^+$ contact region 25 and p$^+$ field alleviation region 27.

Figure 6:
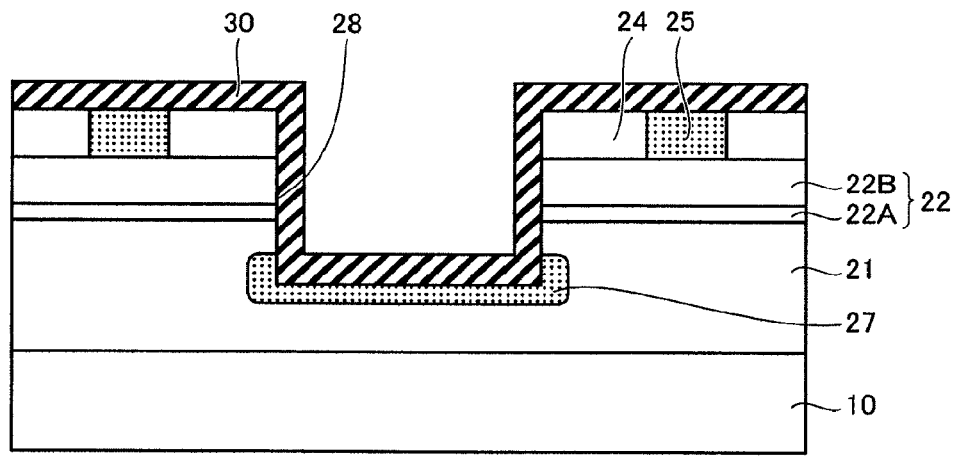
FIG. 6 is a schematic sectional view to describe a method of fabricating an MOSFET.

Then, a gate oxide film formation step is executed as step S50. Referring to FIGS. 5 and 6, thermal oxidation is executed to form a thermal oxide film 30 qualified as gate oxide film 30 at step S50. Thermal oxide film 30 covers the sidewall and bottom wall of the trench, and also the upper surface of n$^+$ source region 24.

Figure 7:
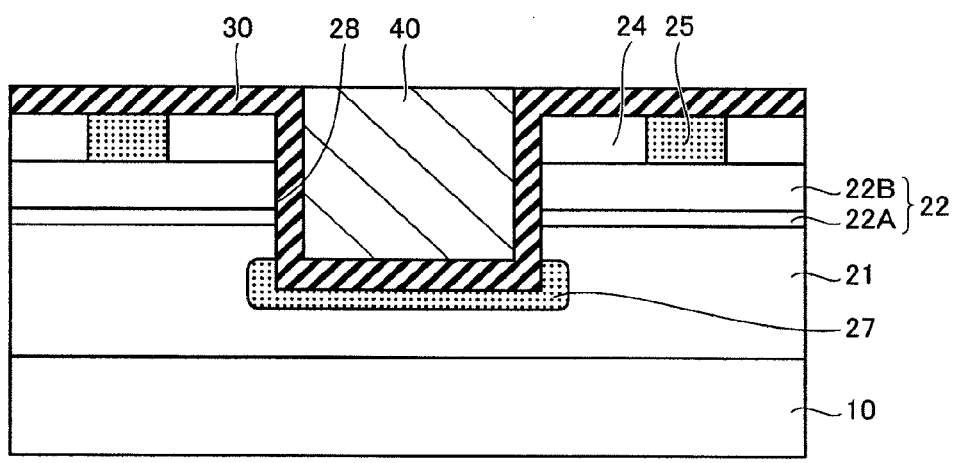
FIG. 7 is a schematic sectional view to describe a method of fabricating an MOSFET.

Then, a gate electrode formation step is executed as step S60. Referring to FIGS. 6 and 7, gate electrode 40 is formed at step S60 so as to fill trench 28 formed at step S30 and having the sidewall and bottom wall covered with thermal oxide film 30 at step S50. Formation of gate electrode 40 can be executed by sputtering, for example.

Figure 8:
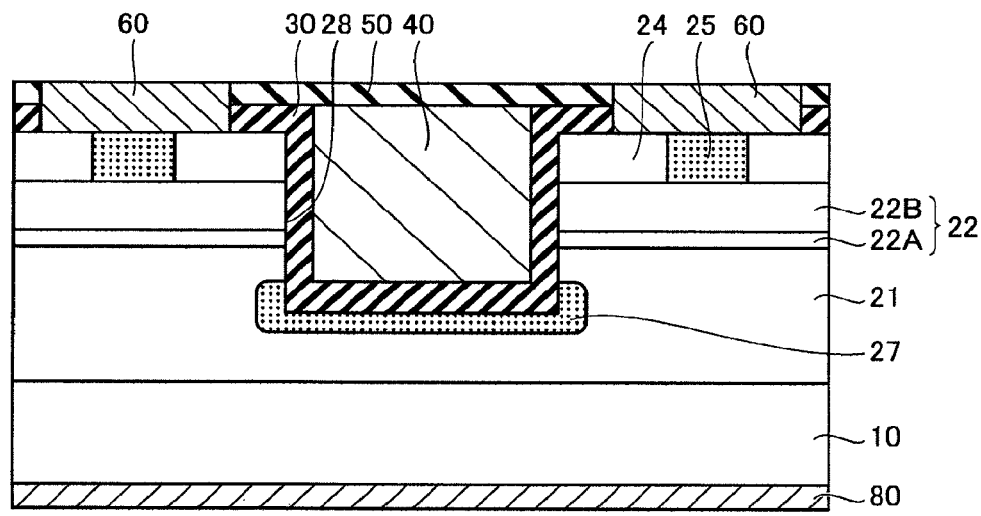
FIG. 8 is a schematic sectional view to describe a method of fabricating an MOSFET.

Then, a contact electrode formation step is executed as step S70. Referring to FIGS. 7 and 8, source contact electrode 60 and drain contact electrode 80 are formed at step S70. Specifically, interlayer insulation film 50 made of silicon dioxide, for example, is formed to cover at least the upper surface of gate electrode 40. Then, thermal oxide film 30 and interlayer insulation film 50 located on the region that is to be brought into contact with source contact electrode 60 in n$^+$ source region 24 and p$^+$ contact region 25 are removed by etching. Then, a nickel film is formed by evaporation at a desired region where source contact electrode 60 and drain contact electrode 80, for example, are to be formed. Then, at least a portion of the nickel film is silicidized by executing alloy-annealing. As a result, source contact electrode 60 forming an ohmic contact with n$^+$ source region 24, and drain contact electrode 80 forming an ohmic contact with silicon carbide substrate 10 are formed.

Then, an interconnection formation step is executed as step S80. Referring to FIGS. 8 and 1, source interconnection 70 and back protection electrode 90 are formed at step S80. Specifically, aluminum is vapor-deposited to cover, for example, source contact electrode 60 and interlayer insulation film 50, and to cover drain contact electrode 80. By the process set forth above, the method of fabricating MOSFET 1 of the present embodiment is completed. By the fabrication method set forth above, MOSFET 1 of the present embodiment can be produced readily.

Second Embodiment

Figure 9:
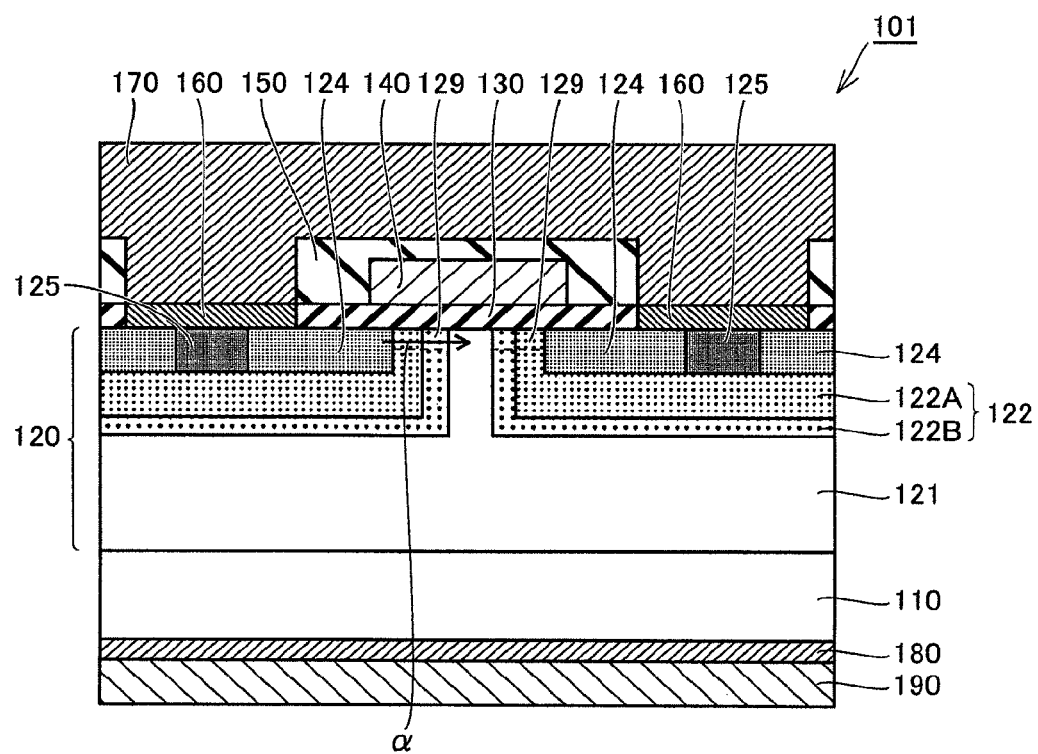
FIG. 9 is a schematic sectional view of a configuration of an MOSFET according to a second embodiment.

A second embodiment 2 that is another embodiment of the present invention will be described hereinafter. Referring to FIG. 9, the semiconductor device of the second embodiment has a configuration basically similar to that of the semiconductor device of the first embodiment, and provides similar effects. However, the difference from the semiconductor device of the first embodiment based on a trench MOSFET (UMOSFET) is that the semiconductor device of the second embodiment has a DMOSFET (planar type MOSFET) configuration.

Specifically, MOSFET 101 that is the semiconductor device of the second embodiment includes a silicon carbide substrate 110, and an active layer 120 arranged on one main face of silicon carbide substrate 110, and identified as an epitaxial growth layer made of silicon carbide.

Silicon carbide substrate 110 is made of single crystal silicon carbide, having an n type conductivity (first conductivity type) by containing impurities such as nitrogen and phosphorus (n type impurity). Active layer 120 includes a drift layer 121, a body region 122, an n$^+$ source region 124, and a p$^+$ contact region 125.

Drift layer 121 is arranged on silicon carbide substrate 110, and has n type conductivity by containing n type impurities lower in concentration than silicon carbide substrate 110. Body region 122 is arranged to include a main face of active layer 120 at a side opposite to silicon carbide substrate 110. Body region 122 has p type conductivity (second conductivity type) by containing impurities such as aluminum and boron (p type impurity). N$^+$ source region 124 is arranged in body region 122 so as to include a main face of active layer 120 at a side opposite to silicon carbide substrate 110. N$^+$ source region 124 has n type conductivity by containing n type impurities higher in concentration than that of drift layer 121.

P$^+$ contact region 125 is arranged in body region 122 so as to include a main face of active layer 120 at a side opposite to silicon carbide substrate 110, and located at the central side of body region 122 relative to n$^+$ source region 124. P$^+$ contact region 125 has p type conductivity by containing p type impurities.

Body region 122 includes a high concentration region 122A arranged to surround n$^+$ source region 124 and p$^+$ contact region 125, containing p type impurities of high concentration, and a low concentration region 122B, arranged to surround high concentration region 122A, and containing p type impurities in lower concentration than in high concentration region 122A.

MOSFET 101 further includes a gate oxide film 130, a gate electrode 140, a source contact electrode 160, an interlayer insulation film 150, a source interconnection 170, a drain contact electrode 180, and a back protection electrode 190.

Gate oxide film 130 is formed of an insulator such as of silicon dioxide, and extends to form contact with $n^+$ source region 124, high concentration region 122A, and low concentration region 122B on a main face of active layer 120 at a side opposite to silicon carbide substrate 110. Gate electrode 140 is arranged in contact on gate oxide film 130, and extends as far as above low concentration region 122B from high concentration region 122A. Gate electrode 140 is formed of a conductor such as of aluminum.

Source contact electrode 160 is arranged on active layer 120 to form contact with $n^+$ source region 124 and $p^+$ contact region 125. Source contact electrode 160 is arranged to form contact with a region on active layer 20 not covered with gate oxide film 130. Source contact electrode 160 is made of a conductor such as of nickel, and has at least the region in contact with active layer 20 silicidized to form an ohmic contact with $n^+$ source region 124.

Interlayer insulation film 150 is arranged on and to cover gate electrode 140, and extends as far as above gate oxide film 130. Interlayer insulation film 150 is formed of an insulator such as of silicon dioxide. Source interconnection 170 is arranged to form contact with source contact electrode 160, and to cover source contact electrode 160 and interlayer insulation film 150. Source interconnection 170 is formed of a conductor such as of aluminum.

Drain contact electrode 180 is arranged in contact on the main face of silicon carbide substrate 110 at a side opposite to active layer 120. Drain contact electrode 180 is formed of a conductor such as of nickel, having at least the region in contact with silicon carbide substrate 110 silicidized to form an ohmic contact with silicon carbide substrate 110. Back protection electrode 190 is arranged on and in contact with and to cover drain contact electrode 180. Back protection electrode 90 is formed of a conductor such as of aluminum.

The operation of MOSFET 101 will be described hereinafter. Referring to FIG. 1, in the case where the voltage of gate electrode 140 is below the threshold voltage, i.e. in an OFF state, the pn junction between body region 122 and drift layer 121 is on a reverse bias, attaining a non-conductive state, even if voltage is applied to drain contact electrode 180 and back protection electrode 190. When a voltage greater than or equal to the threshold voltage is applied to gate electrode 140, an inversion layer 129 is formed in a region of body region 122 in the proximity of contact with gate oxide film 130. As a result, electrical connection is established between $n^+$ source region 124 and drift layer 121. Electrons that are carriers move in the direction of arrow a to cause current flow.

In other words, MOSFET 101 that is a planar type MOSFET includes a silicon carbide substrate 110 made of silicon carbide, an active layer 120 that is an epitaxial growth layer made of silicon carbide and formed on silicon carbide substrate 110, a gate oxide film 130 as a gate insulation film made of an insulator, and arranged in contact with active layer 120, and a gate electrode 140 arranged in contact with gate oxide film 130. Active layer 120 includes a body region 122 in which an inversion layer 229 is formed in the region in contact with gate oxide film 130 by application of voltage to gate electrode 140. Body region 122 includes a low concentration region 122B arranged to include the region where inversion layer 129 is formed, and containing impurities of low concentration, and a high concentration region 122A adjacent to low concentration region 122B in a carrier mobile direction (direction of arrow a) in inversion layer 129, arranged to include a region where inversion layer 129 is formed, and containing impurities higher in concentration than in low concentration region 122B.

In MOSFET 101 of the present embodiment, low concentration region 122B that can ensure high channel mobility and high concentration region 122A that can suppress punch-through are arranged in combination at a region in body region 122 where inversion layer 129 is to be formed. Therefore, high channel mobility can be ensured while suppressing punch-through even in the case where the channel length is shortened. As a result, MOSFET 101 of the present embodiment is a semiconductor device that can have ON resistance reduced while suppressing occurrence of punch-through.

Figure 10:
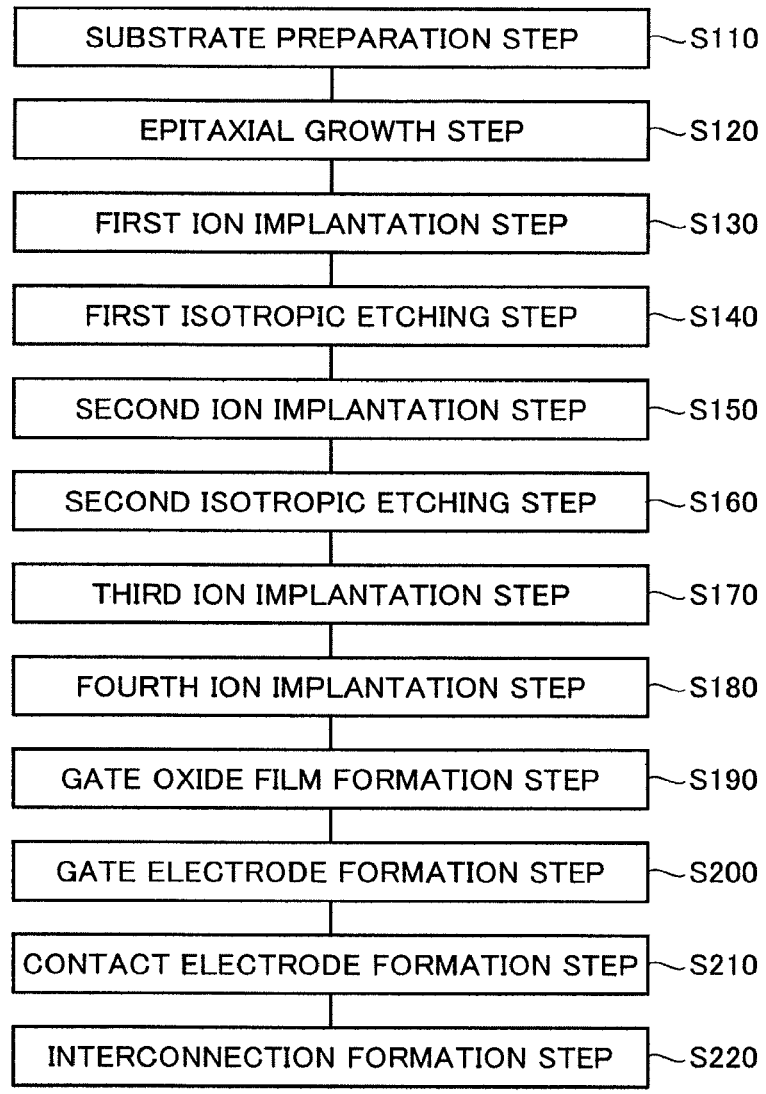
FIG. 10 is a flowchart schematically representing the fabrication procedure of the MOSFET according to the second embodiment.
Figure 11:
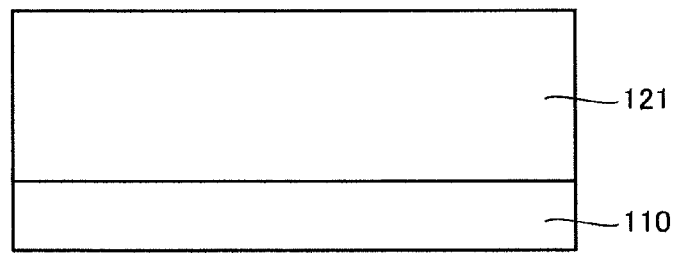
FIG. 11 is a schematic sectional view to describe a method of fabricating the MOSFET according to the second embodiment.

An example of a method of fabricating MOSFET 101 according to the present embodiment will be described hereinafter with reference to FIGS. 10-18. Referring to FIG. 10, in the method of fabricating MOSFET 101 of the present embodiment, a substrate preparation step is executed as step S110. Referring to FIG. 11, a silicon carbide substrate 110 obtained from an ingot of single crystal silicon carbide produced by sublimation, for example, is prepared in step S110.

Then, an epitaxial growth step is executed as step S120. Referring to FIG. 11, drift layer 121 of n conductivity type is formed on one main face of silicon carbide substrate 110 by epitaxial growth in step S120. For n type impurities to attain n type conductivity, nitrogen, phosphorus, and the like can be employed.

Figure 12:
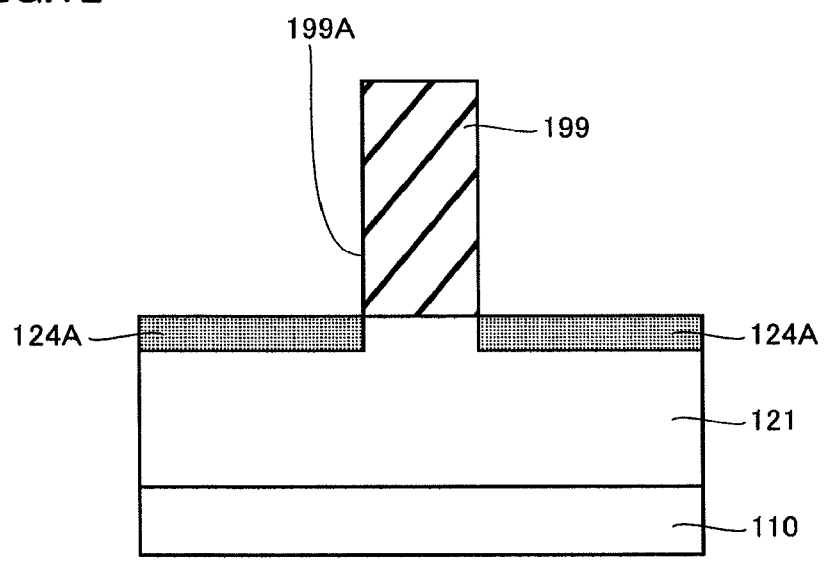
FIG. 12 is a schematic sectional view to describe a method of fabricating the MOSFET according to the second embodiment.

Then, a first ion implantation step is executed as step S130. Referring to FIG. 12, a mask layer 199 having an opening 199A is formed on drift layer 121 at step S130. For mask layer 199, a mask made of silicon dioxide, for example, may be employed. Then, by executing ion implantation using mask layer 199 as a mask, $n^+$ region 124A containing n type impurities higher in concentration than that of drift layer 121 is formed.

Figure 13:
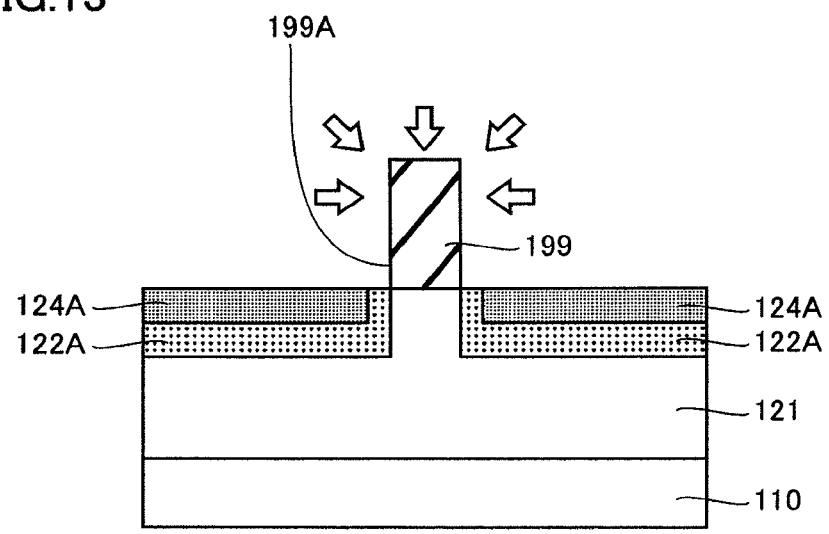
FIG. 13 is a schematic sectional view to describe a method of fabricating the MOSFET according to the second embodiment.

Then, a first isotropic etching step is executed as step S140. Referring to FIG. 13, an opening 199A is enlarged as shown by the arrow, by executing isotropic etching on mask layer 199 used at step S130.

Then, a second ion implantation step is executed as step S150. By executing ion implantation using mask layer 199 having opening 199A enlarged at step S140 as a mask, high concentration region 122A containing p type impurities of high concentration is formed at step S150.

Figure 14:
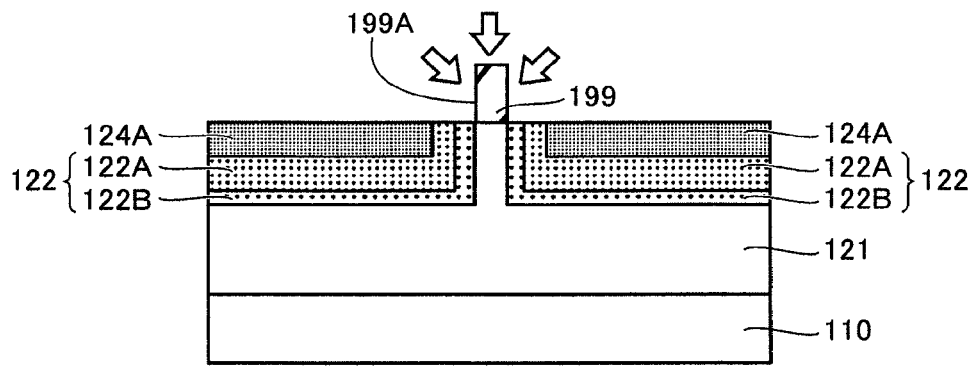
FIG. 14 is a schematic sectional view to describe a method of fabricating the MOSFET according to the second embodiment.

Then, a second isotropic etching step is executed as step S160. Referring to FIG. 14, isotropic etching is executed on mask layer 199 used at step S150 to further enlarge opening 199A, as indicated by the arrow, at step S160.

Then, a third ion implantation step is executed as step S170. At step S170, ion implantation is executed using mask layer 199 having opening 199A enlarged at step S160 as a mask to form low concentration region 122B having an impurity concentration lower than that of high concentration region 122A.

Figure 15:
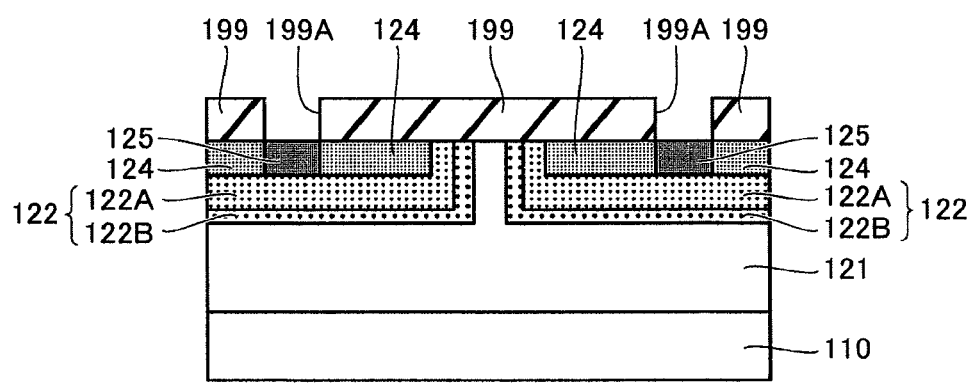
FIG. 15 is a schematic sectional view to describe a method of fabricating the MOSFET according to the second embodiment.

Then, a fourth ion implantation step is executed at step S180. Referring to FIG. 15, mask layer 199 used at step S170 is removed, and then a mask layer 199 having opening 199A at an appropriate position is newly formed at step S180. Then, $p^+$ contact region 125 containing p type impurities of high concentration is formed by executing ion implantation with mask layer 199 as a mask. At this stage, a region of n+ region 124A where p+ contact region 125 is not formed becomes n+ source region 124.

Figure 16:
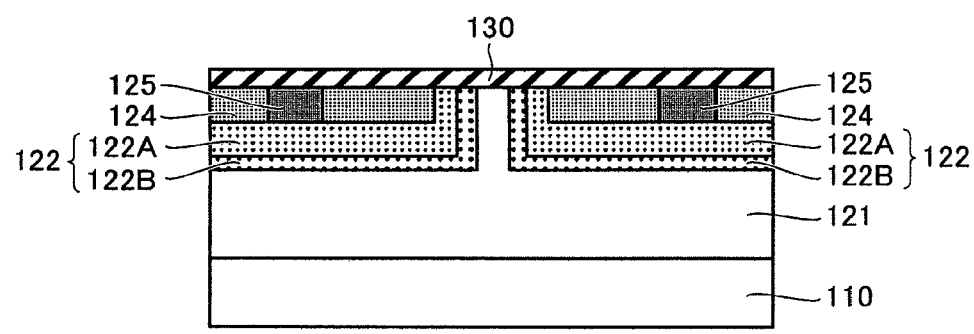
FIG. 16 is a schematic sectional view to describe a method of fabricating the MOSFET according to the second embodiment.

Then, a gate oxide film formation step is executed as step S190. Referring to FIGS. 15 and 16, mask layer 199 used at step S180 is removed, and thermal oxidation is executed to form a thermal oxide film 130 qualified as gate oxide film 130 at step S190. This thermal oxide film 130 is formed to cover entirely the main face of drift layer 121 at the side opposite to silicon carbide substrate 110.

Figure 17:
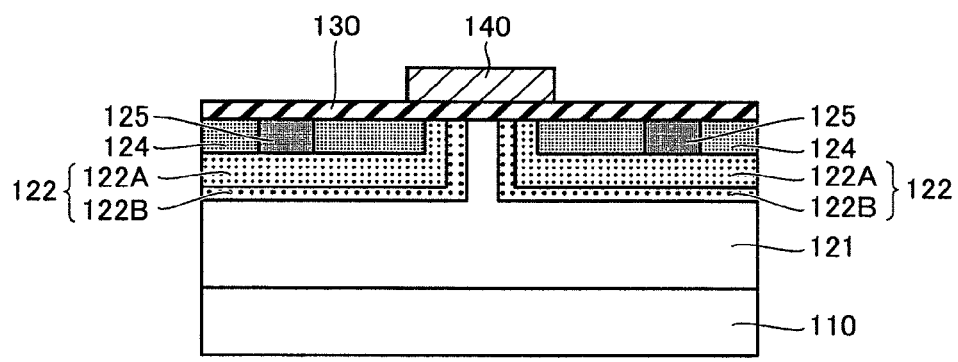
FIG. 17 is a schematic sectional view to describe a method of fabricating the MOSFET according to the second embodiment.

Then, a gate electrode formation step is executed as step S200. Referring to FIGS. 16 and 17, gate electrode 140 is formed on and in contact with thermal oxide film 130 at step S200. Formation of gate electrode 140 can be executed by sputtering, for example.

Figure 18:
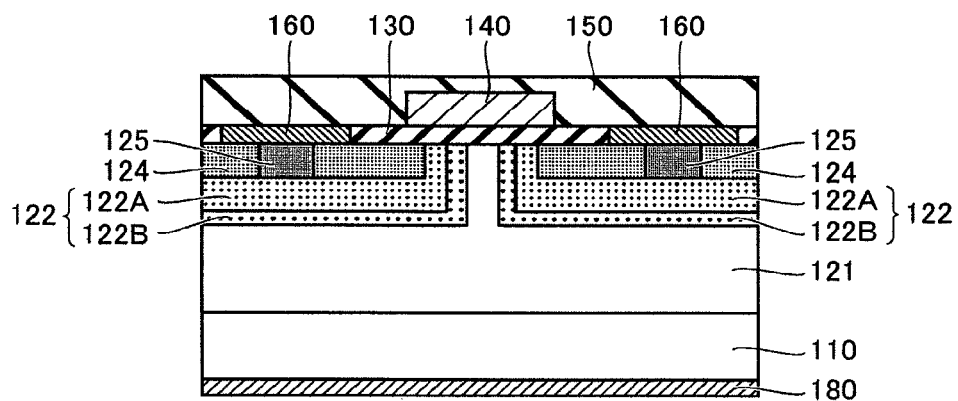
FIG. 18 is a schematic sectional view to describe a method of fabricating the MOSFET according to the second embodiment.

Then, a contact electrode formation step is executed as step S210. Referring to FIGS. 17 and 18, source contact electrode 160 and drain contact electrode 180 are formed at step S210. Specifically, thermal oxide film 130 located on a region to be brought into contact with source contact electrode 160 in n+ source region 124 and p+ contact region 125 is removed by etching. Then, a nickel film is formed by evaporation at a desired region where source contact electrode 160 and drain contact electrode 180, for example, are to be formed. Also, interlayer insulation film 150 made of silicon dioxide is formed to cover the top surface of gate electrode 140, the nickel film corresponding to source contact electrode 160, and thermal oxide film 130. Then, at least a portion of the nickel film is silicidized by executing alloy-annealing. As a result, source contact electrode 160 forming an ohmic contact with n+ source region 124, drain contact electrode 180 forming an ohmic contact with silicon carbide substrate 110, and an interlayer insulation film 150 are formed.

Then, an interconnection formation step is executed as step S220. Referring to FIGS. 18 and 9, source interconnection 170 and back protection electrode 190 are formed at step S220. Specifically, upon removing interlayer insulation film 150 located on source contact electrode 160, for example, aluminum is vapor-deposited to cover source contact electrode 160 and interlayer insulation film 150, and also drain contact electrode 180. By the process set forth above, the method of fabricating MOSFET 101 of the present embodiment is completed.

The method of fabricating MOSFET 101 of the present embodiment includes the steps of preparing silicon carbide substrate 110, forming drift layer 121 as an epitaxial growth layer made of silicon carbide on silicon carbide substrate 110, forming body region 122 at drift layer 121, forming gate oxide film 130 made of an insulator in contact on drift layer 121, and forming gate electrode 140 to which voltage is applied to form inversion layer 129 at the region of body region 122 in contact with gate oxide film 130. The step of forming body region 122 includes the steps of forming mask layer 199 having opening 199A on drift layer 121, forming high concentration region 122A having a first impurity concentration at a region where inversion layer 129 is formed by applying ion implantation with mask layer 199 as a mask, enlarging opening 199A by etching mask layer 199, and forming low concentration region 122B having an impurity concentration lower than that of high concentration region 122 adjacent to high concentration region 122A in a carrier mobile direction a in inversion layer 129, and in a region where inversion layer 129 is formed. By the fabrication method set forth above, MOSFET 101 of the present embodiment can be fabricated readily.

Although the above embodiments have been described corresponding to the case where the semiconductor device of the present invention is applied to a trench type MOSFET (UMOSFET) and a DMOSFET (planar type MOSFET), the semiconductor device of the present invention is not limited thereto. The present invention can be applied to various semiconductor devices controlling the formation of an inversion layer in a channel region according to a predetermined threshold voltage for conducting and cutting off the current. Specifically, the semiconductor device of the present invention can be applied widely to semiconductor devices such as VMOSFET, IGBT, and the like.

It should be understood that the embodiments disclosed herein are by way of example only, and not to be taken by way of limitation. The scope of the invention is defined, not by the description set forth above, but by the appended claims, and all changes equivalent of the limit and bounds of the claims, and all changes that falls within limit and bounds of the claims are intended to be embraced by the claims.

INDUSTRIAL APPLICABILITY

The semiconductor device of the present invention is particularly suitable to a semiconductor device that requires reduction in ON resistance while suppressing occurrence of punch-through.

REFERENCE SIGNS LIST 1, 101 MOSFET; 10, 110 silicon carbide substrate; 20, 120 active layer; 21, 121 drift layer; 22, 122 body region; 22A, 122A high concentration region; 22B, 122B low concentration region; 24, 124 n+ source region; 124A n+ region; 25, 125 p+ contact region; 27 p+ field alleviation region; 28 trench; 29, 129 inversion layer; 30, 130 gate oxide film (thermal oxide film); 40, 140 gate electrode; 50, 150 interlayer insulation film; 60, 160 source contact electrode; 70, 170 source interconnection; 80, 180 drain contact electrode; 90, 190 back protection electrode; 199 mask layer; 199A opening.

The invention claimed is:

1. A method of fabricating a semiconductor device, comprising the steps of:

forming an epitaxial growth layer made of silicon carbide on a silicon carbide substrate of a first conductivity type, said epitaxial growth layer including a drift layer of the first conductivity type, and a body region having a high concentration region of a second conductivity type and a low concentration region of the second conductivity type;

forming a source region of the first conductivity type on said low concentration region to be in contact with said low concentration region;

forming a trench in said epitaxial growth layer to penetrate said low concentration region, said high concentration region, and said source region and reach said drift layer after forming said low concentration region, said high concentration region, and said source region; and forming a gate electrode on a surface of said trench, with a gate insulation film interposed therebetween.

2. The method of fabricating the semiconductor device according to claim 1, wherein an impurity of the second conductivity type is introduced into said epitaxial growth layer such that the impurity of the second conductivity type contained in said high concentration region has a concentration of greater than or equal to $1\times10^{17}$ cm' and less than or equal to $1\times10^{18}$ cm$^{-3}$, and the impurity of the second conductivity type is introduced into said epitaxial growth layer such that the impurity of the second conductivity type contained in said low concentration region has a concentration of less than or equal to $2\times10^{16}$ cm$^{-3}$.

3. The method of fabricating the semiconductor device according to claim 1, wherein said drift layer of the first conductivity type, said high concentration region of the second conductivity type, and said low concentration region of the second conductivity type are formed by epitaxial growth.

4. The method of fabricating the semiconductor device according to claim 1, wherein said source region is formed such that a channel length is less than or equal to 0.5 μm.

5. The method of fabricating the semiconductor device according to claim 1, wherein said drift layer, said high concentration region, said low concentration region, and said source region are formed sequentially.

6. The method of fabricating the semiconductor device according to claim 1, wherein said gate insulation film is formed by thermally oxidizing the surface of said trench including surfaces of said high concentration region and said low concentration region.

7. The method of fabricating the semiconductor device according to claim 1, further comprising the step of forming a field alleviation region at a bottom of said trench and forming a contact region at a surface of said epitaxial growth layer by implanting an impurity of the second conductivity type into the bottom of said trench and the surface of said epitaxial growth layer after forming said trench.

* * * * *